United States Patent
Striemer et al.

(10) Patent No.: US 10,551,165 B2
(45) Date of Patent: Feb. 4, 2020

(54) METHODS AND DEVICES FOR THE HIGH-VOLUME PRODUCTION OF SILICON CHIPS WITH UNIFORM ANTI-REFLECTIVE COATINGS

(71) Applicant: ADARZA BIOSYSTEMS, INC., West Henrietta, NY (US)

(72) Inventors: Christopher C. Striemer, West Henrietta, NY (US); Jared A. Carter, West Henrietta, NY (US); Wade Campney, West Henrietta, NY (US)

(73) Assignee: ADARZA BIOSYSTEMS, INC., St. Louis, MO (US)

( * ) Notice: Subject to any disclaimer, the term of this patent is extended or adjusted under 35 U.S.C. 154(b) by 14 days.

(21) Appl. No.: 15/568,739

(22) PCT Filed: Apr. 29, 2016

(86) PCT No.: PCT/US2016/030212
§ 371 (c)(1),
(2) Date: Oct. 23, 2017

(87) PCT Pub. No.: WO2016/179023
PCT Pub. Date: Nov. 10, 2016

(65) Prior Publication Data
US 2018/0143005 A1 May 24, 2018

Related U.S. Application Data

(60) Provisional application No. 62/155,861, filed on May 1, 2015.

(51) Int. Cl.
*H01L 21/66* (2006.01)
*H01L 21/67* (2006.01)
(Continued)

(52) U.S. Cl.
CPC .... *G01B 11/0625* (2013.01); *H01L 21/67023* (2013.01); *H01L 21/67075* (2013.01);
(Continued)

(58) Field of Classification Search
CPC ......... G01B 11/00; G01B 11/02; G01B 11/06; G01B 11/0616; G01B 2210/56;
(Continued)

(56) References Cited

U.S. PATENT DOCUMENTS 4,751,169 A * 6/1988 Behringer ................ G03F 1/72
250/492.3
4,868,974 A * 9/1989 Nishiguchi ............ H05K 13/02
29/740

(Continued)

FOREIGN PATENT DOCUMENTS

WO 2016/179023 A1 11/2016

OTHER PUBLICATIONS

International Search Report and Written Opinion from related International Application No. PCT/US2016/030212, dated Oct. 11, 2016; 11 pgs.

*Primary Examiner* — Maliheh Malek
(74) *Attorney, Agent, or Firm* — Polsinelli PC; Elton F. Dean, III

(57) ABSTRACT

This present disclosure generally relates to devices, methods, and systems for producing large numbers of SiO₂ coated silicon chips with uniform film thickness controlled to angstrom and sub angstrom levels. The disclosure further relates to etching plates configured for receiving a plurality of chips mounted thereon.

15 Claims, 6 Drawing Sheets

(51) Int. Cl.
   *G01B 11/06* (2006.01)
   *H01L 21/673* (2006.01)
(52) U.S. Cl.
   CPC .. *H01L 21/67086* (2013.01); *H01L 21/67253* (2013.01); *H01L 22/12* (2013.01); *G01B 2210/56* (2013.01); *H01L 21/673* (2013.01); *H01L 21/67057* (2013.01)
(58) Field of Classification Search
   CPC ......... H01L 22/00; H01L 22/10; H01L 22/12; H01L 22/20; H01L 22/22; H01L 22/26; H01L 22/30; H01L 22/34; H01L 21/67; H01L 21/67155–67236; H01L 21/67259–67282; H01L 21/673–67396; H01L 21/70; H01L 21/77; G03F 7/901; G03F 7/3028; G03F 7/70608; G03F 7/70625
   See application file for complete search history.

(56) References Cited

U.S. PATENT DOCUMENTS

| | | | | |
|---|---|---|---|---|
| 5,188,032 | A * | 2/1993 | Lewis | B41C 1/1033 101/453 |
| 5,610,439 | A * | 3/1997 | Hiyoshi | H01L 23/051 257/688 |
| 5,792,305 | A * | 8/1998 | Winsemius | H01L 21/67126 156/345.11 |
| 5,923,995 | A * | 7/1999 | Kao | B81C 1/00896 438/460 |
| 6,115,108 | A * | 9/2000 | Capodieci | G03F 7/70125 355/71 |
| 6,383,824 | B1 * | 5/2002 | Lensing | G01B 11/30 257/E21.528 |
| 6,410,209 | B1 * | 6/2002 | Adams | G03F 7/091 430/311 |
| 6,424,417 | B1 * | 7/2002 | Cohen | G03F 7/70558 250/491.1 |
| 6,428,894 | B1 * | 8/2002 | Babich | C23C 16/26 428/408 |
| 6,433,878 | B1 * | 8/2002 | Niu | G03F 7/70441 356/392 |
| 6,558,965 | B1 * | 5/2003 | Singh | G01B 11/0616 257/E21.029 |
| 6,603,529 | B1 * | 8/2003 | Finarov | G03F 7/3028 355/27 |
| 6,884,646 | B1 * | 4/2005 | Wu | H01L 33/0079 438/22 |
| 6,972,201 | B1 * | 12/2005 | Subramanian | G03F 7/091 257/E21.029 |
| 7,052,921 | B1 * | 5/2006 | Plat | G03F 7/70608 257/E21.53 |
| 7,080,330 | B1 * | 7/2006 | Choo | G03F 7/70625 716/136 |
| 7,645,704 | B2 * | 1/2010 | Shi | B81C 1/00531 134/1.1 |
| 7,759,135 | B2 * | 7/2010 | Theuss | G01P 1/023 257/414 |
| 8,860,184 | B2 * | 10/2014 | Sivakumar | H01L 21/02587 257/618 |
| 2001/0030674 | A1 * | 10/2001 | Matsuzawa | B41J 2/14233 347/70 |
| 2002/0004288 | A1 * | 1/2002 | Nishiyama | H01L 21/561 438/464 |
| 2002/0026952 | A1 * | 3/2002 | Fujino | H01L 21/02052 134/1.3 |
| 2002/0180041 | A1 * | 12/2002 | Sahara | H01L 23/3114 257/738 |
| 2003/0021004 | A1 * | 1/2003 | Cunningham | B81B 3/0051 359/290 |
| 2003/0071994 | A1 * | 4/2003 | Borden | G01N 21/274 356/326 |
| 2003/0082911 | A1 | 5/2003 | Sakamori | |
| 2003/0121889 | A1 | 7/2003 | Takahashi et al. | |
| 2003/0165755 | A1 * | 9/2003 | Mui | G03F 7/70625 430/30 |
| 2003/0228532 | A1 * | 12/2003 | Mui | G03F 7/70625 430/30 |
| 2004/0026700 | A1 * | 2/2004 | Akaike | H01L 33/20 257/79 |
| 2004/0038139 | A1 * | 2/2004 | Mui | G03F 7/70625 430/30 |
| 2004/0120854 | A1 * | 6/2004 | Heath | G01N 33/54373 422/400 |
| 2004/0203174 | A1 * | 10/2004 | Jones | B01L 3/0241 436/180 |
| 2004/0203177 | A1 * | 10/2004 | Davis | G03F 7/70625 438/14 |
| 2005/0048780 | A1 * | 3/2005 | Tanaka | G01N 23/225 438/689 |
| 2005/0217703 | A1 * | 10/2005 | O'Donnell | B05C 11/1039 134/21 |
| 2006/0138399 | A1 | 6/2006 | Itano et al. | |
| 2006/0202223 | A1 * | 9/2006 | Sackrison | H01L 33/22 257/99 |
| 2006/0262287 | A1 * | 11/2006 | Hiar | G03F 7/70616 355/30 |
| 2007/0059847 | A1 * | 3/2007 | Op de Beeck | G03F 7/091 438/7 |
| 2007/0084560 | A1 * | 4/2007 | Fuentes | H01L 21/67057 156/345.11 |
| 2007/0095507 | A1 * | 5/2007 | Henderson | F28D 15/043 165/104.26 |
| 2007/0166633 | A1 * | 7/2007 | Yamada | G03F 7/70358 430/30 |
| 2007/0224827 | A1 * | 9/2007 | Xiao | H01L 21/31138 438/706 |
| 2007/0237383 | A1 * | 10/2007 | Funk | G03F 7/70525 382/144 |
| 2007/0298335 | A1 * | 12/2007 | Sawai | G03F 7/70641 430/30 |
| 2008/0020319 | A1 * | 1/2008 | Yeh | G03F 7/091 430/270.1 |
| 2008/0032426 | A1 * | 2/2008 | Michaelson | H01L 22/12 438/7 |
| 2008/0121784 | A1 * | 5/2008 | Chang | H04N 5/2253 250/208.1 |
| 2008/0128838 | A1 * | 6/2008 | Theuss | B81C 1/00333 257/414 |
| 2009/0075422 | A1 * | 3/2009 | Machida | G03F 9/7076 438/106 |
| 2009/0200546 | A1 * | 8/2009 | Marokkey | G03F 1/44 257/48 |
| 2009/0217950 | A1 * | 9/2009 | Kesil | B08B 3/003 134/21 |
| 2009/0226672 | A1 * | 9/2009 | Meador | G03F 7/039 428/161 |
| 2010/0009470 | A1 * | 1/2010 | Davis | B82Y 10/00 438/9 |
| 2010/0029088 | A1 | 2/2010 | Mayer et al. | |
| 2010/0068101 | A1 * | 3/2010 | Sim | B01L 3/502707 422/400 |
| 2010/0071754 | A1 * | 3/2010 | Chang | H01L 31/022425 136/246 |
| 2010/0120253 | A1 * | 5/2010 | Jeng | H01L 21/31144 438/702 |
| 2010/0197115 | A1 * | 8/2010 | Arita | H01L 21/6835 438/462 |
| 2010/0209830 | A1 * | 8/2010 | Carcasi | G03F 7/70625 430/30 |
| 2010/0311223 | A1 * | 12/2010 | Chun | H01L 21/78 438/462 |
| 2011/0003256 | A1 * | 1/2011 | Van Der Heijden | G03F 7/70466 430/324 |
| 2011/0133345 | A1 * | 6/2011 | Tasaki | G06K 19/07749 257/783 |

(56) References Cited

U.S. PATENT DOCUMENTS

| | | | |
|---|---|---|---|
| 2011/0195579 A1* | 8/2011 | Yen | H01L 21/02057 438/747 |
| 2011/0209826 A1* | 9/2011 | Tadokoro | G03F 7/705 156/345.1 |
| 2011/0244657 A1* | 10/2011 | Grivna | H01L 21/78 438/462 |
| 2012/0248481 A1* | 10/2012 | Seo | H01L 33/486 257/98 |
| 2013/0050700 A1* | 2/2013 | Osten | G01B 11/303 356/369 |
| 2013/0115757 A1* | 5/2013 | Engelhardt | H01L 21/306 438/464 |
| 2013/0215404 A1* | 8/2013 | Den Boef | G01J 3/4412 355/44 |
| 2013/0258301 A1* | 10/2013 | Dehe | G03F 1/44 355/55 |
| 2014/0319557 A1* | 10/2014 | Cho | H01L 33/007 257/94 |
| 2015/0004721 A1* | 1/2015 | Akimoto | H01J 37/32926 438/9 |
| 2015/0111315 A1 | 4/2015 | Grimbergen | |
| 2015/0126042 A1* | 5/2015 | Pasquale | H01L 21/02274 438/761 |
| 2015/0138523 A1* | 5/2015 | Jak | G03F 7/70625 355/67 |
| 2015/0227650 A1* | 8/2015 | Song | H01J 37/32935 703/2 |
| 2016/0131983 A1* | 5/2016 | Holovinger | H01L 22/12 356/401 |
| 2016/0154319 A1* | 6/2016 | Mossavat | G03F 7/705 355/67 |
| 2016/0284568 A1* | 9/2016 | Morris | H01L 21/568 |
| 2016/0313653 A1* | 10/2016 | Mink | G03F 7/705 |
| 2016/0363871 A1* | 12/2016 | Van Oosten | G03F 7/70516 |
| 2016/0372893 A1* | 12/2016 | McLaurin | H01L 24/95 |
| 2017/0025304 A1* | 1/2017 | Xu | H01L 21/76224 |
| 2017/0121842 A1* | 5/2017 | Wang | C25F 3/12 |
| 2017/0207066 A1* | 7/2017 | Park | H01J 37/32009 |
| 2017/0285477 A1* | 10/2017 | Tanigaki | C08K 3/36 |
| 2018/0351069 A1* | 12/2018 | Boukai | H01L 35/30 |
| 2019/0074242 A1* | 3/2019 | Watanabe | H01L 23/49503 |

* cited by examiner

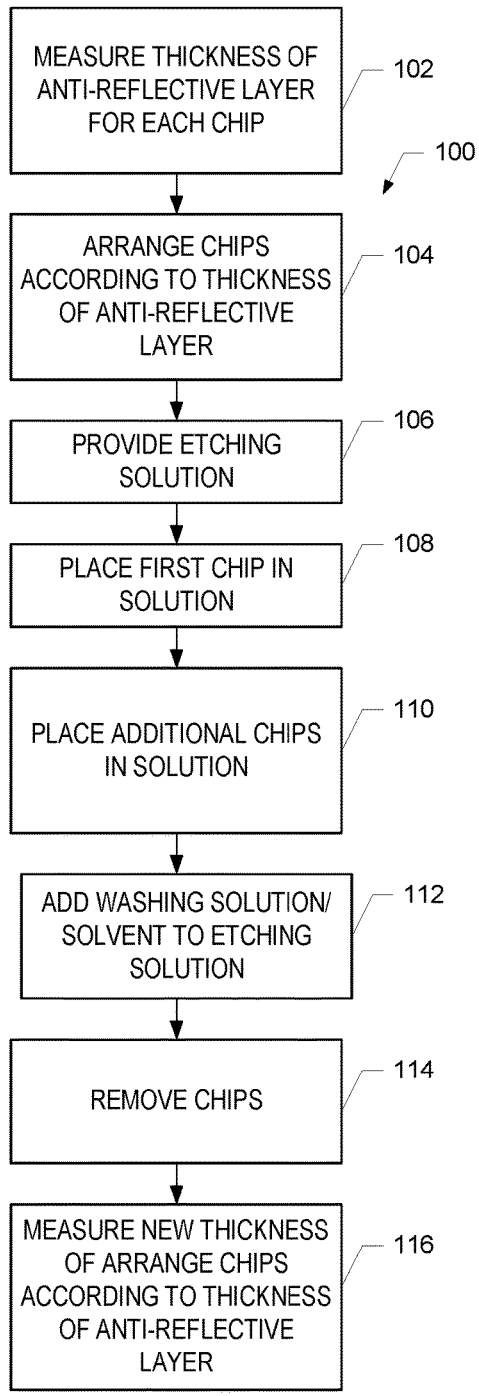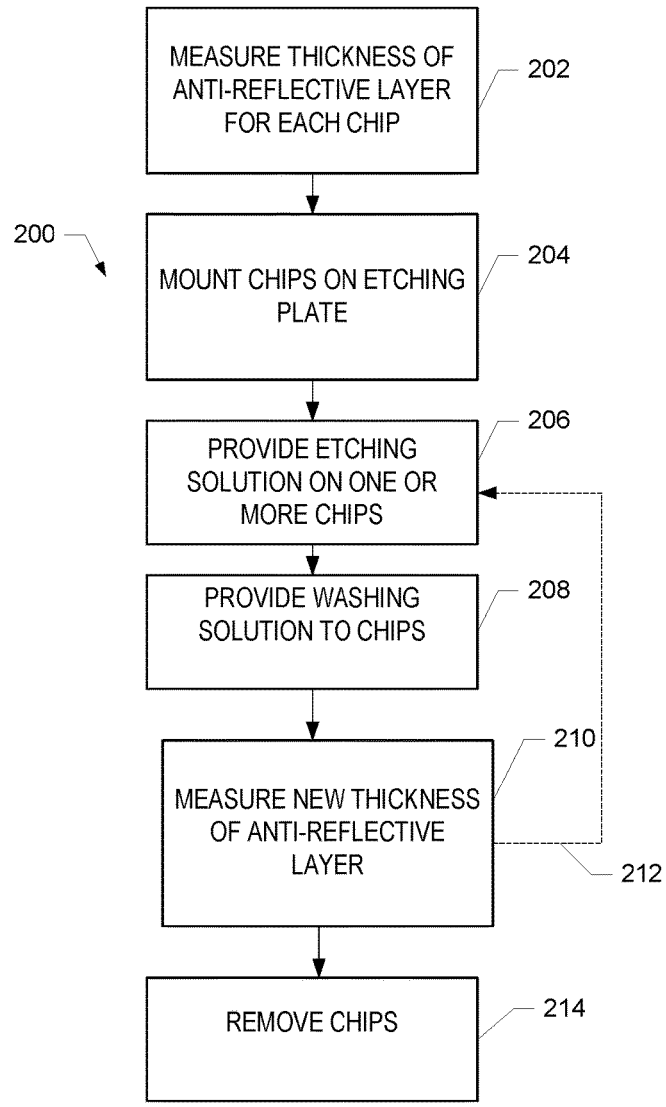
FIG. 1
FIG. 2

METHODS AND DEVICES FOR THE HIGH-VOLUME PRODUCTION OF SILICON CHIPS WITH UNIFORM ANTI-REFLECTIVE COATINGS

RELATED APPLICATIONS

The present application claims priority to U.S. Provisional Patent Application No. 62/155,861, entitled "Methods and Devices for The High-Volume Production of Silicon Chips With Uniform Anti-Reflective Coatings," filed on May 1, 2015; the entire contents of which are incorporated herein by reference in its entirety.

FEDERALLY SPONSORED RESEARCH OR DEVELOPMENT

Not Applicable.

COMPACT DISK APPENDIX

Not Applicable.

BACKGROUND

Arrayed Imaging Reflectometry (AIR) is an emerging technology that has vast potential for use in a number of diagnostic applications among others. To gather a large volume of highly accurate data, a number of AIR diagnostic chips or slides having precise coatings of an anti-reflective coating, such as a silicon dioxide ($SiO_2$) film, are required. Moreover, the thickness of the anti-reflective coating must be accurately produced to sub-angstrom tolerances. The antireflection phenomenon at the core of AIR relies on extreme and absolute control of film thickness.

Typically, the required anti-reflective coatings and films are produced by growing an oxide film or layer thicker than required on a silicon wafer, cutting (dicing) the wafer into individual chips, and then slowly removing the oxide layer on the chips to thin the film to the desired value. Typically, commercially supplied silicon wafers and chips have a thickness uniformity range of approximately ±1% of the target thickness. This roughly corresponds to a variance of approximately ±14 Å for the targeted thickness of ~1400 Å, which decreases the accuracy of data gathered using the chips without a final tuning of thickness.

Thus, there exists a need for a method and related devices for efficiently preparing a large number of coated chips having very precise anti-reflective coatings with minimal variation, on the order of sub-angstroms, across the large number of wafers.

SUMMARY

This present disclosure generally relates to devices, methods, and systems for producing large numbers of $SiO_2$ coated silicon chips with uniform film thickness controlled to angstrom and sub angstrom levels. In general, the Arrayed Imaging Reflectometry (AIR) platform relies on having a supply of coated silicon chips each with nearly identical anti-reflective film thickness. In various aspects, the acceptable tolerance for variation across the coated chips is approximately less than or equal to 1 Angstrom; and preferably less than or equal to 0.2 Angstroms or approximately equal to ⅕th the diameter of a hydrogen atom.

In various aspects, the desired thickness for the anti-reflective layer of the AIR chips is typically in the range of 1320 Å to 1400 Å. The desired thickness may vary depending on the probe molecules for each particular array. In various other aspects, the devices, methods, and systems of the present disclosure are configured to produce large numbers of coated chips with a substantially narrow anti-reflective layer thickness distribution (e.g. less than 1 Å tolerances) in order to support and implement the AIR bio-detection technology on a large scale. In other aspects the desired tolerance for variation across the coated chips is less than 0.2 Å

In particular, the present disclose relates to a method of efficiently etching a plurality of silicon chips coated with an anti-reflective coating, such that the thickness of the coating is nearly identical or at least within a tolerance of less than or equal to 0.2 Angstroms.

The present disclosure also relates to etching plates specially configured to receive and retain a plurality of silicon chips for batch etching. In one aspect, the etching plates have a footprint substantially similar to existing micro plates.

In one embodiment, a method for high throughput etching of a plurality of coated chips includes measuring a first initial thickness of an anti-reflective coating on a first chip of the plurality of chips and measuring a second initial thickness of an anti-reflective coating on a second chip of the plurality of chips. The method also includes determining a first etch time duration for the first chip and determining a second etch time duration for the second chip. The method further includes providing an etching solution, contacting the first chip with the etching solution, and contacting the second chip with the etching solution. After etching at least one chip, the method includes providing a washing solution, contacting the first chip with the washing solution at a conclusion of the first etch time duration, and contacting the second chip with the washing solution at a conclusion of the second etch time duration. Lastly, one embodiment of the method includes measuring a first reduced thickness of the anti-reflective coating on the first chip and measuring a second reduced thickness of the anti-reflective coating on the second chip.

In another embodiment, a method for high throughput etching of a plurality of coated wafers, includes measuring an initial thickness of an anti-reflective coating on each of the plurality of chips, determining an amount of the anti-reflective coating to be removed from each of the plurality of chips, and determining an etch duration for each of the plurality of chips. The method also includes generating a schedule at a computing device having a processor and a memory. The schedule includes an etch start time and an etch stop time for each of the plurality of chips; wherein the etch start time and the etch end time correspond to the etch duration.

The method further includes transmitting the schedule from the computing device to a liquid handling system. where the liquid handling system dispenses an etching solution at a corresponding etch start time and dispenses a washing solution at a corresponding etch stop time for each of the plurality of chips. Lastly, the method includes providing an etching plate having the plurality of chips mounted thereon to the liquid handling system, etching the plurality of chips using the liquid handling system, and measuring a reduced thickness of an anti-reflective coating on each of the plurality of chips after the sequence.

In various aspects, generating a schedule may include identifying a first chip of the plurality of chips having a shortest etch duration and assigning a first time block comprising the etch start time and the etch stop time for the first. Generating schedule may also include identifying each other chip of the plurality of chips based on increasing etch times and assigning other time blocks comprising the etch times and etch start times for the other chips; wherein the other time blocks are assigned according to the increasing etch times of the other chips.

In various other aspects, generating a schedule at a computing device may include identifying a first chip of the plurality of chips having a longest etch duration and assigning a first time block comprising the etch start time and the etch stop time for the first. In one aspect, the schedule generation also includes identifying each other chip of the plurality of chips based on decreasing etch times, assigning other time blocks comprising the etch times and etch start times for the other chips; where the other time blocks are assigned according to the decreasing etch times of the other chips, and determining if a conflict occurs between the etch stop time for the first chip and etch start time of a second time block of the other time blocks; where the second time block corresponds to a second longest etch duration. If no conflict occurs, then generating the schedule includes reserving a time in the schedule for the second time block. If a conflict occurs, then generating the schedule includes advancing the second time block by one or more time units until no conflict occurs and reserving the second time block at advanced time.

In yet another embodiment, a method for high throughput etching of at least one coated chips includes measuring an initial thickness of an anti-reflective coating on the at least one chip, determining an etch time duration for the at least one chip, and contacting the at least one chip with an etching solution. The method further includes contacting the at least one chip with a washing solution at a conclusion of the etch time duration and measuring a first reduced thickness of the anti-reflective coating on the at least one chip.

The present disclosure also relates to an etching plate for mounting one or more chips thereon. The etching plate includes a plate base and one or more elongated pedestals engaged to the plate base, where the pedestals project away from the plate base.

BRIEF DESCRIPTION OF THE DRAWINGS

FIG. 1 is a flowchart for a method for manually etching a plurality of silicon chips coated with an anti-reflective material.

FIG. 2 is a flowchart of a method for the automated large-scale etching of a plurality of silicon chips coated with an anti-reflective material, according to one embodiment.

DETAILED DESCRIPTION

In various embodiments, the devices, methods, and systems disclosed herein offer substantial improvements over current methods of manually etching diced AIR chips having an anti-reflective coating thickness greater than the target value. In particular, the devices, methods, and systems permit the large-scale production of AIR chips having precise tolerances. For example, the AIR chips may be produced on the order of thousands per day or greater. In another aspect, the overall process times and yields are dictated, at least in part, by the efficiency with which the chips can be measured, time etched, rinsed, dried, and measured again. It is highly desirable to automate this process to scale to higher volumes of chips and improve yield.

Embodiments of the present disclosure relate to various methods for producing the precisely layered AIR chips on a large scale. By way of example and not limitation, one such method includes the cleaning of a series of diced AIR chips, coated with an anti-reflective layer greater than the desired thickness. The chips are then coarse-etched to get the thickness within a few Angstroms of the target thickness and the exposed to one or more fine etching processes that reach the sub-Angstrom accuracy desired. Other embodiments of the present disclosure relate to devices and other structural components to facilitate the large-scale production. For example, the devices include specially configured plates for handling and mounting the chips during the various etching processes.

FIG. 1 is a flowchart illustrating one embodiment of a method 100 for producing a plurality of anti-reflective material coated chips having a near uniform coating within a tolerance of approximately 1 Angstrom or less and preferably 0.2 Angstroms. By way of example, the final chips may have a coating of the anti-reflective material having a thickness in the range of 1320 Å to 1400 Å, and preferably in a range between 1362 Å and 1375 Å. At 102, the thickness of the anti-reflective layer on each chip is measured using spectroscopic ellipsometry; however, other methods of measuring the layer may also be used. At 104, the chips are arranged in order according to the thickness of the anti-reflective layer.

Figure 9:
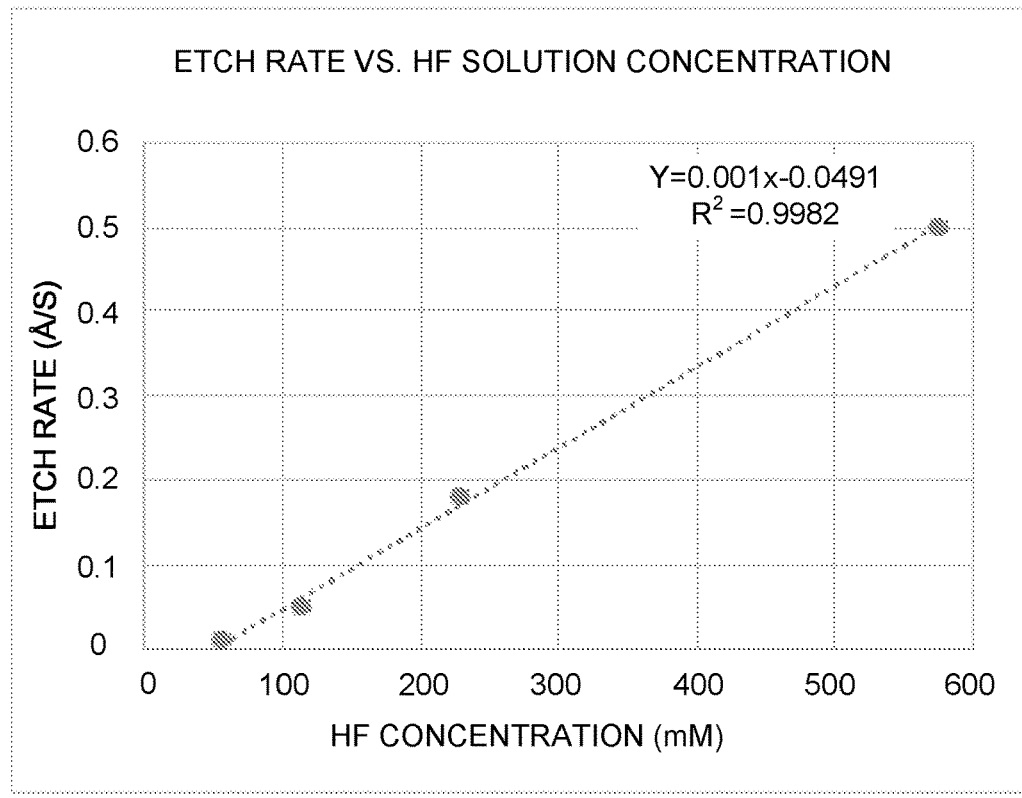
FIG. 9 is a graph depicting calculated etching rates against etching solution concentrations, according to one embodiment.

In various aspects, the anti-reflective layer commonly used in AIR is silicon dioxide ($SiO_2$); however, other anti-reflective compositions may also be used. In one aspect, the etch times for each of the chips is determined using known etch rates for hydrofluoric acid (HF) etching. By way of example, the etch time for each chip may be in a range between one second and 10 minutes. Shorter or longer etch times may also be used in various embodiments. A graph of typical etch rates for etching $SiO_2$ as plotted against various concentrations of dilute HF solutions, is shown in FIG. 9. As shown, low etch rates equal to fractions of an Angstrom per second are used to precisely etch the chips. Although the precise methods and etch times disclosed herein are calculated and based on the use $SiO_2$, it is well within the scope of the present application to vary the etch rate to correspond to other anti-reflective materials.

Referring again to FIG. 1, a small shallow dish or container filled with a dilute HF solution is provided at 106. At 108, the chips are placed in the container in a desired order. For example, the chip having the thickest anti-reflective layer and therefore the longest etching time is inserted first. At 110, other chips are inserted into the container based on their required etch time. After the last chip is inserted and etched for the determined etch duration at 112, an additional solution, such as, but not limited to deionized water (DI) is introduced into the container to rinse away the HF and stop the etching processes. The HF may also be physically drained away prior to or during the rinsing process. The chips are dried and removed at 114 and the thickness of the anti-reflective layer on the chips may be measured again optionally, again at 116, to confirm the uniformity of the etching process and determine if additional etching is necessary. In various aspects, the method 100 may be repeated if the initial etching process was not intended to obtain the target thickness, but rather performed to etch the chips incrementally.

Another embodiment of a method 200 for the large-scale production of the precisely coated chips is illustrated by a flowchart in FIG. 2. The method 200 may be performed using a liquid handling system or robot that is commonly available. In this method, a plurality of coated chips are etched to the desired layer thickness upon being mounted to a plate having a footprint substantially similar to micro well plates or micro plates that are commonly used in conjunction with the liquid handling systems or robots. The thickness of the anti-reflective layer on one or more chips is measured using, any suitable method, including but not limited to spectroscopic ellipsometry, at 202. At 204, one or more chips are mounted on an etching plate, such as plates 500 and 600 shown in FIGS. 5-8. In various aspects, the chips may be mounted onto the etching plate first, and then measured. Thus, steps 202 and 204 may be performed in any order according to various embodiments. In various embodiments, the chips are measured first and the measured data is used to determine placement of the chips on the plate 500 or 600. In other embodiments that use a liquid handling system, the placement position may be less important. In these embodiments, the ability to etch the chips regardless of any specific order offers additional advantages, such as saving considerable time, for example.

The plate having a plurality of chips mounted thereon is introduced into the liquid handling system. The chips will be contacted by an etching solution for etching in a sequential programmed manner. This etching process includes sufficient temporal periods to stop etching for each chip at the required time without conflict. In one aspect, the chips are provided to start etching those having the shortest etching time and ending with those requiring the longest etch times. In one aspect, the method 200 is counter to the method 100 of FIG. 1. In various other aspects, using computerized systems allows further optimization through one or more optimization algorithms designed for maximizing throughput.

At 206, the etching is initiated by pipetting a small volume, such as a droplet, of a dilute HF solution onto the surface of one or more chips. In one aspect, the pipetted volume is a consistent volume needed to cover the chip. The consistent volume may vary depending upon the liquid applied. For example, a consistent volume within a range of 20-50 uL of etching solution may be dispersed onto each chip, while a consistent volume within a range of 50-90 uL of a rinsing liquid may be applied for chips that are approximately 5 mm×6 mm. The wetting properties of the chip's glass surface ensure that the etch solution quickly and completely covers each chip so the entire surface etches uniformly. The etching solution contacts and etches the anti-reflective layer, thereby reducing the thickness of the layer uniformly across the surface of the chip.

At the conclusion of the calculated etching duration for each chip, a small volume of a washing solution, including but not limited to DI water, is pipetted onto the surface of one or more chips at 208. The washing solution displaces and/or neutralizes the etch solution and leaves the washing solution on the chip, thus quickly and completely stopping the etch process. By way of example and not limitation, adding calcium chloride ($CaCl_2$) to the wash solution will provide a getter for the fluoride ions that are required to etch the $SiO_2$.

Figure 8:
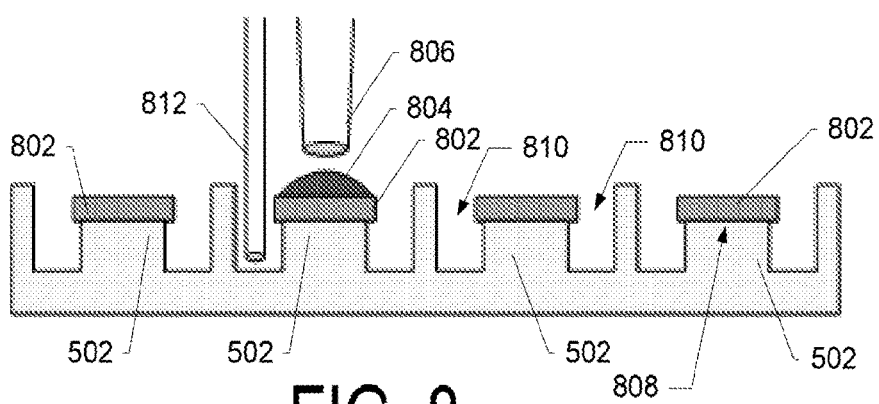
FIG. 8 is a cross-sectional view of an etching plate for holding one or more chips during an etching process, according to one embodiment.

As shown in relation to FIG. 8, according to one embodiment, the displaced etch solution is washed from the chip surface and collected in the plate. In various aspects, the washing solution may include DI in a solution with glycerol, or another low vapor pressure hygroscopic solution to prevent the evaporation of the washing solution from the chip surface after the etching process. In another embodiment, the method 200 may be performed in a humidity-controlled environment.

Optionally, the chips are measured at 210 to determine the new thickness of the anti-reflective layer. As indicated by 212, the process 200 may be partially repeated to remove additional material from the anti-reflective layer. After the desired etching has occurred, the chips may be removed from the etching plate at 214.

While it is simpler in method 200 to etch the chips starting with the shortest etching duration, as there are minimal time conflicts, if any, with dispensing the wash solution, other embodiments of the method may be performed that start etching with the longest required etch. Alternately, the method may also be performed in an arbitrary fashion, using programmed steps according to any complex scheduling algorithm that limits scheduling conflicts and according to any physical or inherent limitations of the liquid handling system.

The preferred method of sequential etching that begins with the shortest etch durations has proved to be a simple approach for minimizing time conflicts. Additionally, this order is well suited for implementation by a variety of standard pipetting robots; such as but not limited to those manufactured or sold by Tecan, Hamilton, and Perkin-Elmer, among others.

Figure 3:
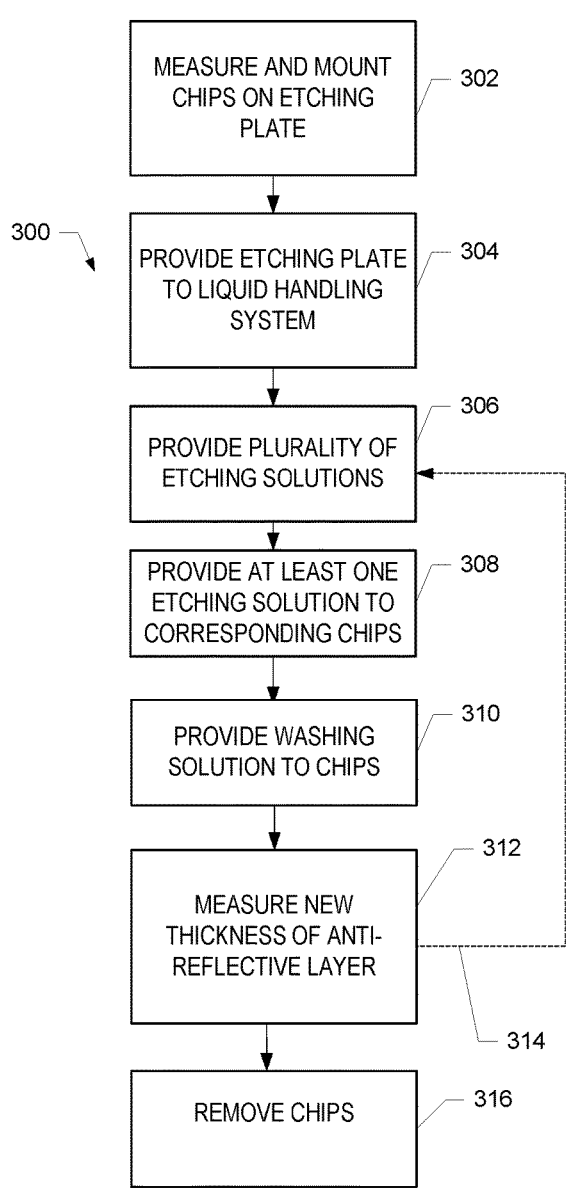
FIG. 3 is a flowchart of a method for the automated large-scale etching of a plurality of silicon chips coated with an anti-reflective material, according to one embodiment.

In another embodiment, as shown in FIG. 3, another method 300 for etching multiple chips simultaneously may be performed. In this method 300, the concentration of the etch solution is varied, according to the thickness of the anti-reflective layer on each of the chips, while the etching duration is kept constant. In this embodiment, a plurality of chips are measured and mounted on to an etching plate at 302, and the plate is introduced into the liquid handling system at 304. At 306, a plurality of etching solutions are provided, while at 308 the plurality of etching solutions are applied to the corresponding chips mounted on the plate. Following a simultaneous etching period for all the chips, the chips are contacted with a washing solution at 310. Similar to the method 200, the chips produced according to the method 300, may be washed in a manner to prevent complete drying of the chip surface during the etching and washing process. Optionally, the chips are dried and measured at 312 to determine the new thickness of the anti-reflective layer. As indicated by 314, the process 300 may be partially repeated to remove additional material from the anti-reflective layer. After the desired etching has occurred, the chips may be removed from the etching plate at 316.

Figure 4:
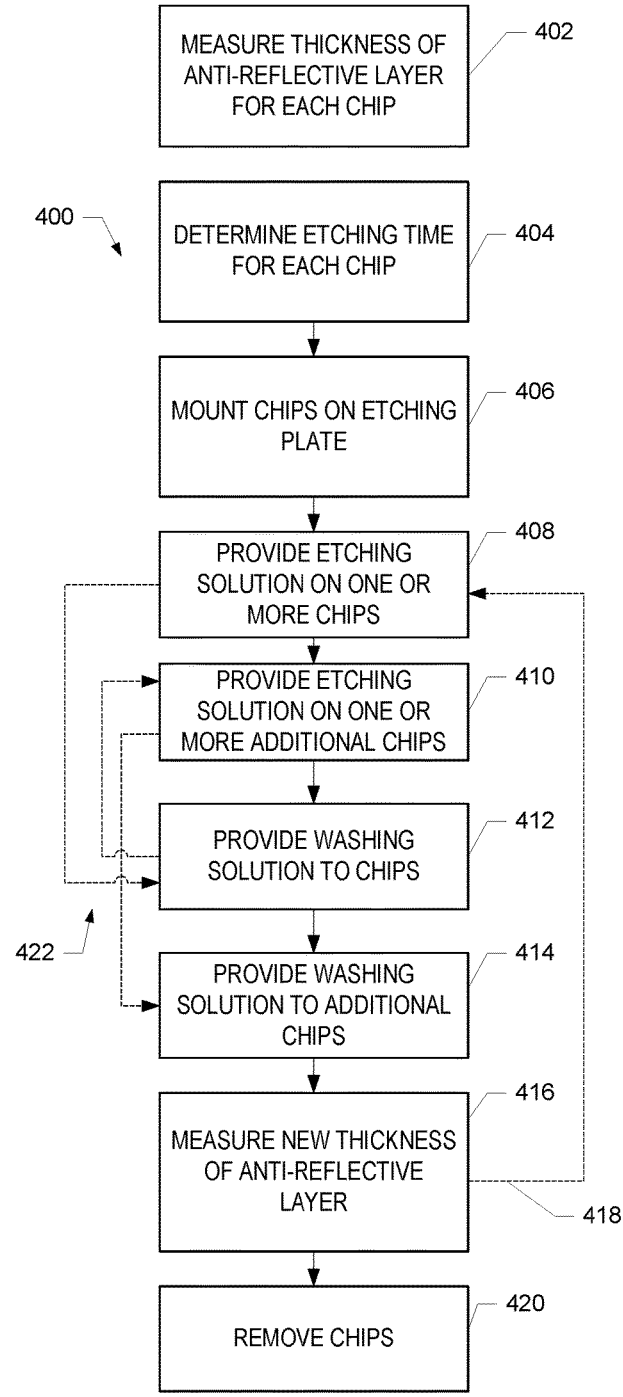
FIG. 4 is a flowchart of a method for the automated large-scale etching of a plurality of silicon chips coated with an anti-reflective material, according to one embodiment.
Figure 10:
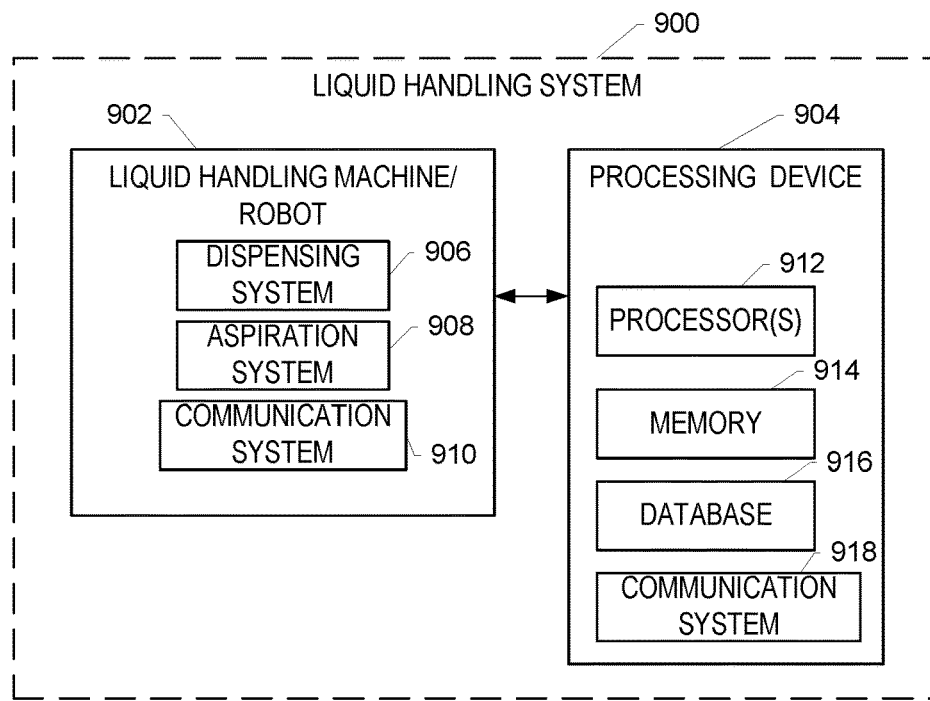
FIG. 10 is a box diagram of a liquid handling system according to one embodiment.
Figure 11:
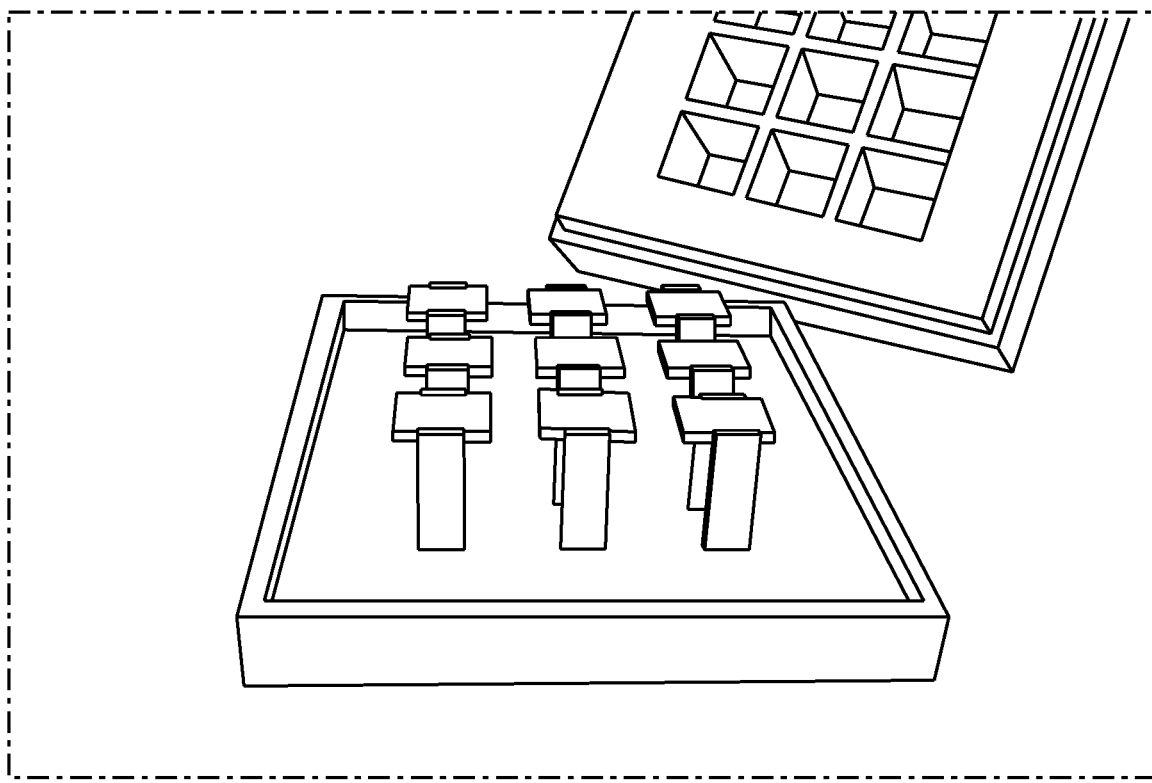
FIGS. 11-12 are photographs of chips mounted on an etching plate according to one embodiment.
Figure 12:
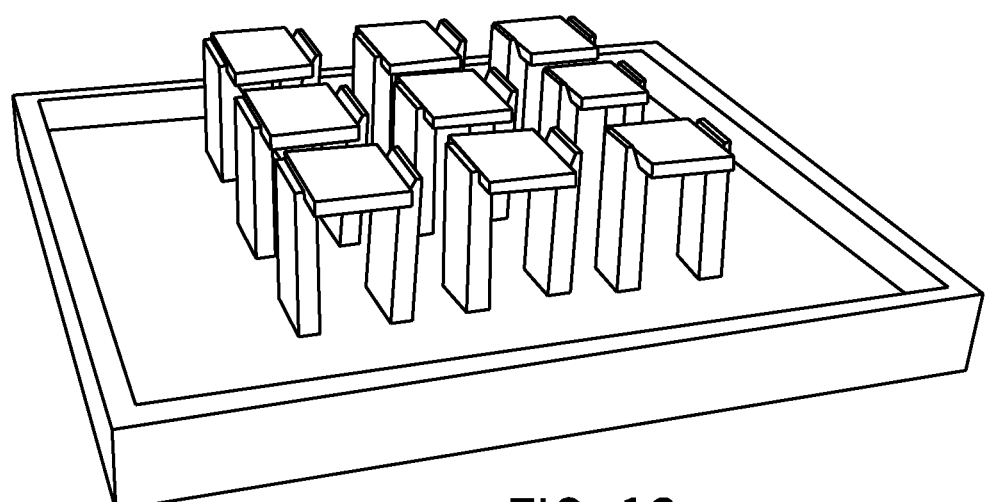

FIG. 4 is a flow chart illustrating yet another method 400 for the large-scale production of the anti-reflective material coated chips. In this method, a plurality of chips are etched nearly simultaneous in a liquid handling system 900 as shown in FIG. 10, that has been specifically programmed to maximize the efficiency of the etching process. Similar to other methods disclosed herein, the chips are measured to determine an initial thickness of the anti-reflective layer at 402. The etching time for each chip is determined at 404. The chips are then mounted on to an etching plate at 406. Based upon the data gathered at 402, one or more chips are provided with an etching solution at a first time point at 408. At 410, one or more additional chips are provided with an etching solution at a second time point, as determined by the measured thickness of the anti-reflective layers. At a third time point, indicated as 412, the washing solution is provided to the chips etched at the first time point. At a fourth time point, indicated as 414, the washing solution is provided to the chips etched at the second time point. At the conclusion of the process to etch all of the mounted chips at least once, the chips are measured at 418, and the method 400 is repeated if necessary, at least in part, as indicated by 418. The chips may then be removed at 420 for use or additional processing.

As generally indicated by 422, the identification of multiple time points etching and washing each chip may be determined on an individual basis. As such, the liquid handling system may be programmed to etch and wash each chip in a predetermined sequence, as generally indicated by 422.

Therefore, according to one aspect, the maximum time necessary to etch a plate of chips can be determining by the formula: $(X_w \cdot P)+(T_{max})$; where $X_w$ equals the number of chips mounted on the plate, P equals the pipetting interval, and $T_{max}$ equals the longest etch time duration for any chip or chips on the plate. As used herein, the pipetting interval refers to the time necessary for the liquid dispensing head to move into position over the etch plate and dispense the appropriate liquid. In one aspect, the liquid dispensing head will hover over the last dispense location until it is instructed to move to another. In another aspect, the liquid dispensing head may return to a home position, based upon the constraints of the liquid handling system. In this aspect, the time to return home is factored into the pipetting interval.

When performing the method 400, it is preferable to program the liquid handling system 900 in a manner to minimize the amount of time that the dispensing head is at rest. This includes programming the system 900 to dispense the etching solution to multiple chips in a single operation, dispensing the washing solution to multiple chips in a single operation, and/or programming the system 900 to alternate sequences of dispensing the etching solution with sequences of dispensing the washing solution. As such the first, second, third, and fourth time points may correspond to start and stop instructions programmed into the LHS 900.

In one embodiment, the system 900 may include a scheduling protocol programmed to maximize the efficiency of a method for the large scale production of the anti-reflective material coated chips, such as the method 400, while eliminating conflicts in scheduling. In one aspect, the most efficient algorithm goes through a series of required etch durations (one for each chip) and assigns to each etching occurrence a start time and a stop time, on a master schedule. The start time designates when the etch solution is dispensed on the specified chip and the stop times corresponds to a time point at which the wash solution is dispensed. In one aspect, the master schedule is associated with a clock having a default interval of approximately two seconds. This default interval is, at least in part, based on the minimum time required for a pipette on the liquid handler to move from any location on the plate to another location and dispense a fluid. Based on this interval, a dispense operation (etch or wash) can occur approximately every 2 sec. The scheduling protocol is therefore setup as a series of two second units.

When executed a computing device reorganizes the set of required etch times from longest duration to shortest duration. The first unit in the schedule protocol is allocated to the start of the longest etch duration. This in turn also determines and reserves a time unit associated with dispensing wash solution at the end of the required etch duration. The computing device then assigns a time block to the second longest etch, and initially assigns its start to the second time block. The computing device then checks the schedule at the end of the required etch duration for that chip to determine if the time unit corresponding to the wash dispense step is open. If so, the scheduling protocol reserves the time units for both the start and stop times for the second etching occurrence. This process continues until a conflict is found whereby the calculated etching stopping or wash dispensing cannot be scheduled due to a conflict at the future time block required to stop the etch. When the wash dispense cannot be scheduled, the start time is then moved forward by one time unit and the scheduler again determines if the desired stop time unit is available. Eventually, the start and stop times for all etches are assigned with a near-optimal scheduling efficiency.

In each method, 100, 200, 300, or 400 the measured layer thickness on each chip prior to etching is used to determine the amount of the $SiO_2$ film that needs to be removed. Using a dilute hydrofluoric acid etchant with a slow and highly stable etch rate, as illustrated in FIG. 9, the etch time duration required for each chip is also determined. According to various embodiments, the methods 100, 200, 300, and 400 can be repeated or be performed in various combinations and sequences, as desired, to perform incremental etching to achieve greater thickness accuracy in the chips.

According to various aspects, by performing successive timed etches on each chip to incrementally reduce the thickness of the anti-reflective layer, it is believed that the desired uniformity can be achieved for batches of 200 chips or more per day, per technician using manual methods. In other aspects, where automated process are used and optimized according to the disclosures herein, a liquid handling system may provide 2500 or more chips per eight hour shift.

The present disclosure also relates to specially configured etching plates 500 and 600, as shown on FIGS. 5-8, for mounting and supporting the chips 802 during one or more of the etching process 200 and 300. In various embodiments, the etching plate 500 has the same general length 510, width 512, and maximum height 514, of a commonly used micro plate, such that the etching plate can be used with existing liquid handling systems or robots with minimal customization.

Figure 5:
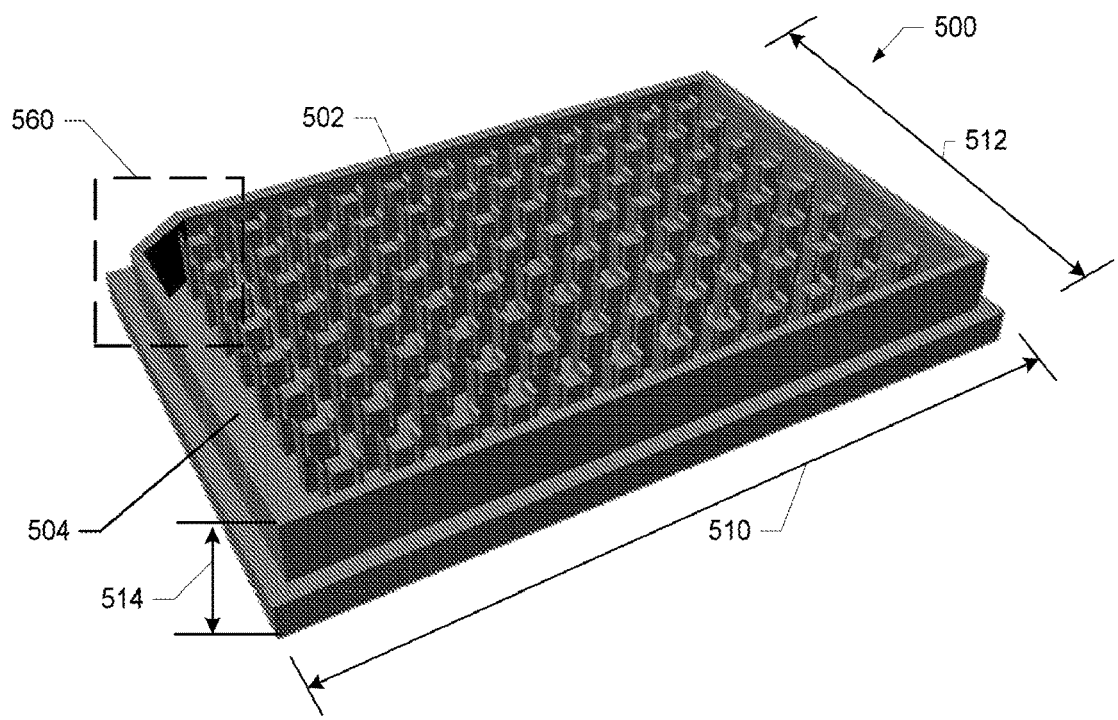
FIG. 5 is a perspective view of an etching plate for holding one or more chips during an etching process, according to one embodiment.
Figure 6:
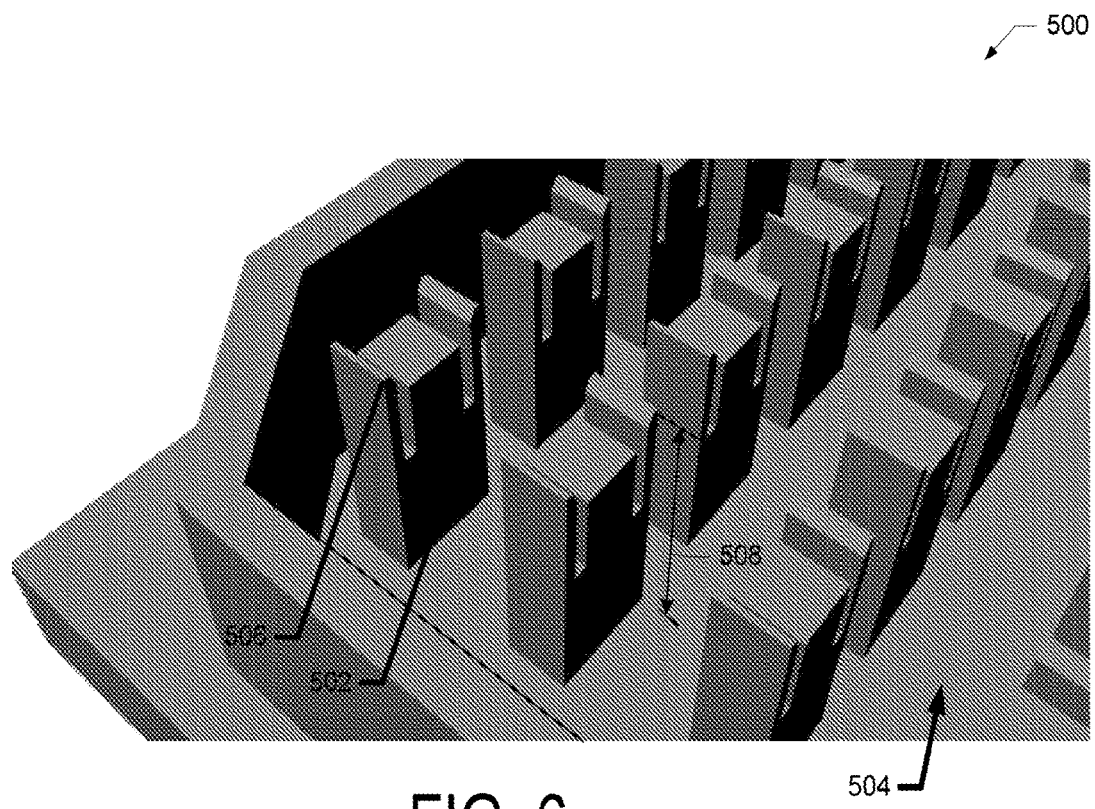
FIG. 6 is a close-up perspective view of a portion of the etching plate of FIG. 5.

FIG. 5 is a perspective view of one embodiment of the etching plate 500, while FIG. 6 is an enlarged close-up view of a portion of the etching plate, as indicated by 560. The etching plate 500 is similar to a 96-well plate that includes a number of pedestals 502 for the stable mounting of individual chips and reservoirs 504 to collect displaced etching solution, following the application of washing solution. In various embodiments, the pedestals 502 are positioned to correspond with the location of each well, in a typical multi-well plate. Alternately, the array of pedestals 502 may be free standing and the displaced etching solution is collected in one or more shared reservoirs 504, as shown in FIG. 6.

In various embodiments, the chips 802 are received and held within resilient tension projections or fingers 506 that project away from the top portion of each pedestal 502. In one aspect, the tension fingers 506 apply constant pressure on the chips 802 to prevent the chips from moving during handling and fluid dispensing. The fingers 506 are preferable constructed of a material that will not scratch or mar the chips 802, such that the chips can be subsequently removed from the plate with no physical trace or defects from being held in the plate 500. Moreover, the fingers 506 engage the chip without occluding the top surface of the chip. Additionally, the plates 500 and components therein are constructed of durable chemical resistant materials such that the plate can be reused without modification.

In various aspects, the elevated positioning of the chips 802 on the pedestals 502, as shown in FIG. 8, allows for easily measuring the anti-reflective layer thickness on the chips using any suitable method, including but not limited to spectroscopic ellipsometry, which detects light incident onto the chip surface at an oblique 70 degree angle from normal incidence. In one embodiment, the pedestals 502 are configured such that the top surfaces of the chips 802 are coplanar or level with the top surface of the plate 500. In other aspects, the pedestals 502 may extend away from the plate bottom 508 greater or lesser distances so that top surface of the chips is higher or lower, respectively, than the top surface of the plate 500.

Figure 7:
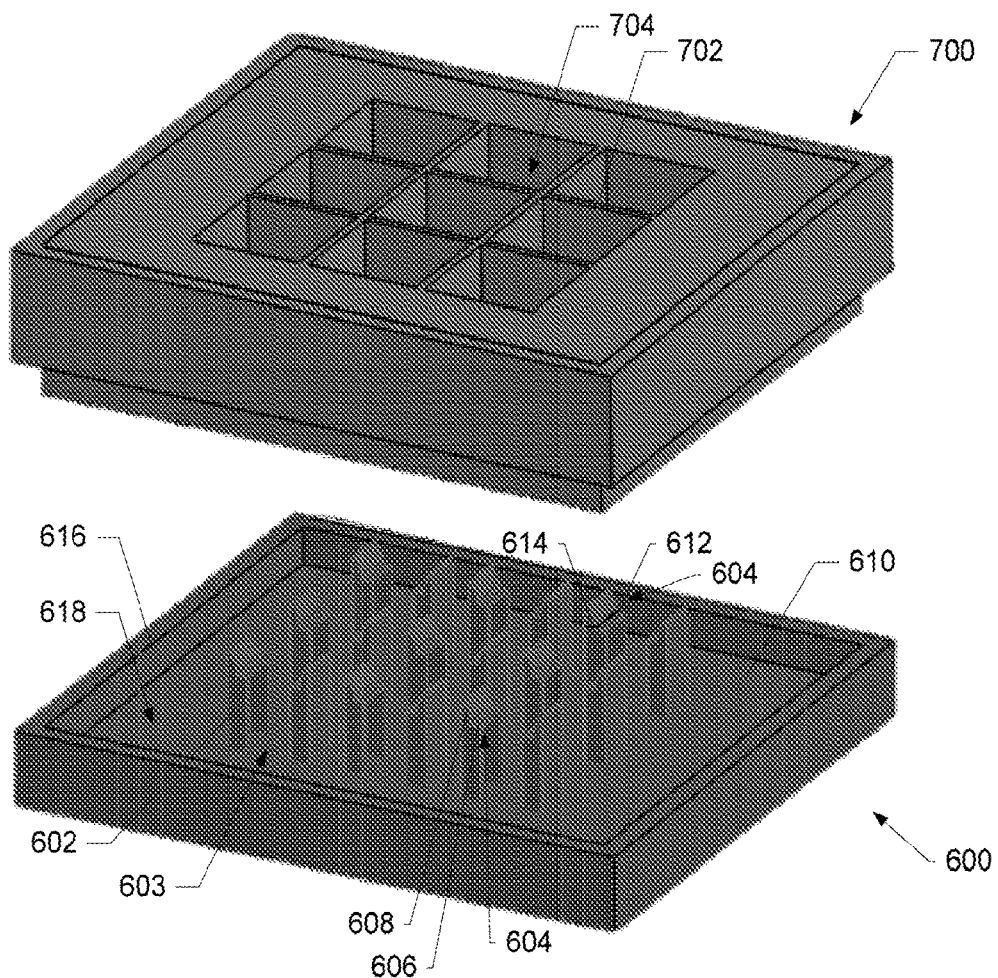
FIG. 7 is a perspective view of an etching plate with a removable barrier attachment for holding one or more chips during an etching process, according to one embodiment.

Another embodiment of an etching plate 600 is shown in FIG. 7. This embodiment includes multiple pairs 603 of support projections 602 that receive and retain chips loaded therein. As shown, each is an independent structure extending from the base surface 610 of the plate 600. In one embodiment, the support projections 602 are of a unitary construction and include a shelf portion 604, defined by a ridge 606, and back portion 608. In this embodiment, a chip is received between opposing projections 602 of a single pair 603, such that a bottom portion of the chip rest upon the shelf portion 604, while the back portions 608 engage the sides of the chip. In another embodiment, the support projections 602 may be a composite construction and include the shelf portion 604, defined by the top surface 612 of the projection and resilient finger projection 614 affixed to the top surface that forms the back portion 608.

In various embodiments, the pedestals 502 and support projections 602 are modular components that may be removed and replaced. By way of example, and not limitation, the pedestals 502 and projections 602 may be engaged to the plates 500 and 600, respectively, by inserting a portion of the pedestal or projection into an opening or hole in the bottom of the plates. As such, with the pedestals 502 or projections 602 removed the bottom surface of the plates may resemble a pegboard. In another embodiment, multiple pedestals 502 or projections 602 may be fabricated in modular units having a 2×2 or 3×3 configuration. In this configuration a block of pedestals or projections may be replaced should one become damaged, thus allowing the plate to be repaired and reused.

In various embodiments, the support projections 602 may be longer and more flexible than the pedestals 502, shown in FIG. 5. In one aspect, the paired arrangement of the support projections 602 allows the use of a wedge or cam (not shown) to be inserted between each projection of a pair 603 to spread them apart for chip loading. The base surface 610 and sidewall 616 of the etching plate 600 may further define a well 618 for collecting fluids, including but not limited to displaced etching solutions that run off of the chips 802.

In one aspect, the etching plate 600 may be engaged to a removable barrier 700 that may be placed onto the plate 600 to provide barriers between projection pairs 603 as well as defining reservoirs 704 around each pair. In another aspect, the walls 702 of the barrier 700 extend above the height of a chip loaded onto the plate 600, to physically isolate each chip and prevent any cross-contamination or other artifacts due to splashing during any liquid dispensing process. Typically, the removable barrier 700 is engaged to the plate 600 during the etching and washing processes, yet removed for loading and removing the chips and measuring the thickness of the anti-reflective layers.

While the etching plate 600 and barrier 700 are shown for receiving nine chips, the number of pedestal pairs and the barrier wall 702 configuration, may be scaled up or down for embodiments of the etching plate 600 configured for etching and washing any number of chips. By way of example and not limitation, 96 projection pairs and a barrier 700 defining 96 wells may be provided to wash up to 96 chips in a single plate 600.

FIG. 8 is a partial cross-sectional view of an embodiment of an etching plate 800, with multiple chips 802, loaded therein. As shown, fluids, such as the etching solution or the washing solution are pipetted as a droplet 804 onto an elevated chip 802 by a pipette 806 of the liquid handling system 900. The chip may be retained on the pedestal 502 by fingers 506 as shown and described in FIG. 6. Alternatively, the chips 802 may be retained on the pedestal 502 by a non-permanent removable adhesive 808. The reservoirs 810 collect and retain fluid that runs off of the chip surface, including etching solution or the washing solution. The overflow fluids may then be removed from the reservoir 810 by an aspiration needle 812 or vacuum of the liquid handling system. Alternately, there may be a gravity drain (not shown) within any embodiment of the etching plate.

FIG. 10 is a box diagram of a liquid handling system according to one embodiment. The liquid handling system 900 includes one or more liquid handling machines 902 including or at least in communication with and one or more processing devices 904. The liquid handling machine 902 may be any programmable machine, robot, or system or combination of programmable machines, robots, or systems suitable for dispensing and/or withdrawing fluids. In various embodiments, the liquid handling machine includes multiple dispensing nozzles and a deck space for supporting a plurality of plates.

The liquid handling machine 902 is typically configured for accurately pipetting and/or removing small volumes of fluid. In one aspect, the liquid handling machine may include a fluid dispensing system 906, an aspiration system 908, and a communication system 910. The fluid dispensing system 906 may further include one or more fluid conduits and nozzles in communication with one or more fluid sources. The aspiration system 908 may include one or more fluid conduits in communication with a vacuum system and, optionally a waste disposal system. The communication system 910 may include one or more displays and inputs for inputting data to the machine 902. The communication system 910 may also include one or more components for communication through a communication network, such as but not limited to the Internet, an intranet, a local area network, a wireless local network, a wide area network, or another communication network, as well as combinations of networks.

The processing device 904 may be a personal computer, workstation, server, mobile device, mobile phone, processor, and/or other processing device. The device 904 may include one or more processors 912 that process software or other machine-readable instructions and may include a memory 914 to store the software or other machine-readable instructions and data. The memory may include volatile and/or non-volatile memory. The device 904 may further include or at least communicate with one or more data structures and/or databases 916. Additionally, the device 904 may also include a communication system 918 to communicate via a wireline and/or wireless communications, such as through the Internet, an intranet, and Ethernet network, a wireline network, a wireless network, and/or another communication network. The processing device 904 may further include a display (not shown) for viewing data, such as a computer monitor, and an input device (not shown), such as a keyboard or a pointing device (e.g., a mouse, trackball, pen, touch pad, or other device) for entering data and navigating through data, including exams, images, documents, structured data, unstructured data, HTML pages, other web pages, and other data.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology.

The invention claimed is:

1. A method for high throughput etching of a plurality of coated silicon chips, the method comprising:
   measuring an initial thickness of an anti-reflective coating on at least one chip of the plurality of chips;
   determining an amount of the anti-reflective coating to be removed from the at least one chip;
   determining an etch duration for the at least one chip;
   generating a schedule at a computing device having a processor and a memory, the schedule comprising an etch start time and an etch stop time for the at least one chip; where the etch start time and the etch end time define the etch duration;
   transmitting the schedule from the computing device to a liquid handling system, where the liquid handling system dispenses an etching solution at a corresponding etch start time and dispenses a washing solution at a corresponding etch stop time for the at least one chip;
   providing an etching plate having the plurality of chips mounted thereon to the liquid handling system;
   etching the plurality of chips by dispensing the etching solution to multiple chips in a single operation, using the liquid handling system; and
   measuring a reduced thickness of an anti-reflective coating on the at least one chip after the sequence.

2. The method of claim 1, wherein the initial thickness of the anti-reflective coating is greater than 1320 Å.

3. The method of claim 1, wherein the etching solution comprises hydrofluoric acid.

4. The method of claim 1, wherein the washing solution comprises deionized water.

5. The method of claim 1, wherein the at least one chip is contacted with the washing solution for a period between one second and 10 minutes.

6. The method of claim 1, wherein the reduced thickness of the anti-reflective coating on the at least one chip is in a range between 1320 Å to 1400 Å with a tolerance of 0.5 Å.

7. The method of claim 1, wherein the plurality of chips is etched in sequence based on the schedule.

8. The method of claim 1, wherein two or more of the plurality of chips are etched simultaneously.

9. The method of claim 1, wherein the washing solution further comprises calcium chloride.

10. A method for high throughput etching of a plurality of coated chips, the method comprising:
    measuring an initial thickness of an anti-reflective coating on the at least one of the plurality of chip;
    determining an etch time duration for at least one of the plurality of chips;
    contacting multiple chips in a single operation, with an etching solution;
    contacting at least one of the plurality of chips with a washing solution at a conclusion of the etch time duration; and
    measuring a first reduced thickness of the anti-reflective coating on at least one of the plurality of chips.

11. An A reusable etching plate for removable mounting one or more chips thereon; the etching plate comprising:
    a plate base; and
    one or more elongated pedestals engaged to the plate base, where the pedestals project away from the plate base; wherein the one or more elongated pedestals comprises fingers projecting away from a top portion of each pedestal, wherein the fingers are configured to apply constant pressure to at least two sides of the removable engaged chips.

12. The etching plate of claim 11 further comprising one or more sidewalls disposed around a perimeter of the plate base.

13. The etching plate of claim 11 further comprising a removable barrier comprising one or more interior walls defining one or more reservoirs.

14. The etching plate of claim 13 wherein the one or more reservoirs surrounds at least one elongated pedestal.

15. The etching plate of claim 11 wherein each of the one or more elongated pedestals further comprises opposing support structures.

* * * * *